United States Patent [19]

Fluegel et al.

[11] Patent Number: 4,963,976
[45] Date of Patent: Oct. 16, 1990

[54] INTEGRATED ELECTRICAL CONDUCTING, COOLING AND CLAMPING ASSEMBLY FOR POWER SEMICONDUCTORS

[75] Inventors: Theodore D. Fluegel, Rockford; Bryan W. Dishner, Roscoe, both of Ill.

[73] Assignee: Sundstrand Corporation, Rockford, Ill.

[21] Appl. No.: 243,511

[22] Filed: Sep. 12, 1988

[51] Int. Cl.⁵ .................................. H01L 25/04
[52] U.S. Cl. ................................. 357/82; 357/71
[58] Field of Search ..................... 357/82, 65, 71

[56] References Cited

U.S. PATENT DOCUMENTS 3,921,201 11/1975 Eisele et al. .......................... 357/82

Primary Examiner—William L. Sikes
Assistant Examiner—Robert E. Wise
Attorney, Agent, or Firm—Wood, Phillips, Mason, Recktenwald & Vansanten

[57] ABSTRACT

A multiple phase electronic semiconductor package 10 including a stack of electrically conductive plates 12 with two opposed clamping plates 14, at least one interposed semiconductor component 16 and two side plates 18 flanking the stack. The height of the side plates 18 is a predetermined amount less than the combined height of the conductive plates 12 and semiconductor components 16. Threaded fasteners 20 secure the opposed clamping plates 14 to the side plates 18 causing the opposed clamping plates 14 to abut the side plates 18, and thereby creating a specific clamping force between the conductive plates 12 and semiconductor components 16.

11 Claims, 1 Drawing Sheet 4,963,976

INTEGRATED ELECTRICAL CONDUCTING, COOLING AND CLAMPING ASSEMBLY FOR POWER SEMICONDUCTORS

FIELD OF THE INVENTION

This invention relates to a multiple phase electronic semiconductor package, and more particularly, to an improved assembly for conducting, cooling and clamping power semiconductors.

BACKGROUND OF THE INVENTION

Many types of conventional semiconductor packages include an array of electrical components where the electrical components must be assembled under a prescribed pressure for proper operation. Commonly, the proper pressure to be applied is determined by a complicated internal gauge assembly. See, for example, U.S. Letters Pat. No. 3,715,632. There are problems with this, however. It requires the construction, placement and maintenance of the gauge assembly, thereby increasing the cost of the package and requires trained technicians. Also, the assembly of the package and gauge must be simultaneous, thereby complicating the task and adding to its inconvenience. Further, the resulting package is often bulky and heavy, thereby restricting its use. Still further, the entire package must be taken apart and reassembled to calibrate, maintain or repair the gauge. Still further, due to heat build-up within the package during use, a cooling system must be provided. The cooling system in conventional packages is difficult to design and construct and is usually inefficient.

The present invention is directed to overcoming one or more of the above problems.

SUMMARY OF THE INVENTION

It is the principle object of the invention to provide a new and improved multiple phase electronic semiconductor package. More specifically, it is an object of the invention to provide an efficient, relatively maintenance-free, easy to construct assembly for cooling and clamping power semiconductors in a conducting array.

According to one facet of the invention, a multiple phase electronic semiconductor package is provided with a stack of electrically conductive plates, including two opposed clamping plates, with at least one interposed semiconductor component and two side plates flanking the stack. A means is provided to secure the opposed clamping plates to the side plates to thereby cause pressure between the conductive plates and semiconductor components. The size and shape of the side plates are such as to provide a predetermined, proper pressure between the conductive plates and semiconductor components.

The present invention obviates the necessity of a complicated internal gauge system as the type of material and/or geometry of the side plates determines the proper clamping force. Additionally, trained technicians are not required to assemble the package. As a result of the inherent simplicity of construction, an unskilled operator can merely secure the opposed clamping plates to the side plates and obtain the proper clamping force. Additionally, due to a building-block type of assembly, the resulting package is not bulky or heavy and is more suitable for use. Further, no gauge ever has to be repaired, calibrated or maintained.

In a preferred embodiment, the electronic semiconductor package is rectangular.

In a highly preferred embodiment, the semiconductor package is formed of a stack of electrically conductive plates, including two opposed clamping plates, at least one interposed semiconductor component and two side plates flanking the stack. The height of the side plates is a predetermined amount less than the combined height of the stack of the electrically conductive plates and semiconductor components. A means is provided to secure the opposed clamping plates to the side plates causing the opposed clamping plates to abut the side plates and create a predetermined amount of pressure between the plates and semiconductor components. Additionally, due to heat build-up during use, the side plates thermally expand with the conductive plates and semiconductor components so that the pressure within the package is maintained relatively constant throughout and over a substantial temperature gradient. Coolant inlet and exit caps are provided at opposite ends of the package and passages are disposed in the conductive plates and extend throughout. Fluid is introduced in the coolant inlet cap, flows through the passages in the conductive plates and exits through the coolant outlet cap, and thereby efficiently cools the package.

Other objects and advantages will become apparent from the following specification taken in connection with the accompanying drawings.

DESCRIPTION OF THE PREFERRED EMBODIMENT

Figure 1:
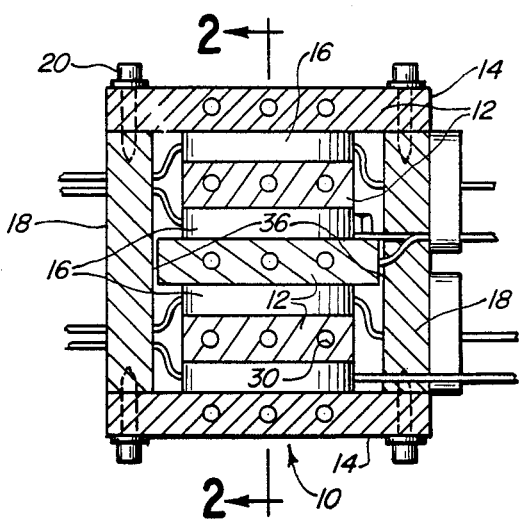
FIG. 1 is a vertical sectional view of a semiconductor package made according to the invention and taken approximately along the line 1—1 in FIG. 2.

An exemplary embodiment of a multiple phase, specifically three phase, electronic semiconductor package is illustrated in the drawings. However, the invention is not limited to any specific circuitry arrangement and has applicability to single or multiple phase arrangements.

The multiple phase electronic semiconductor package is generally designated 10 and includes a stack of electrically conductive plates 12, two vertically opposed clamping plates 14, at least one interposed semiconductor component 16, and two side plates 18 flanking the stack of plates 12. If desired, more than one stack of the plates 12 could be used.

The side plates 18 are disposed between the opposed clamping plates 14, the height of the side plates 18 being a predetermined amount less than the combined height of conductive plates 12 and interposed semiconductor components 16. The length of the side plates 18 is equal to the length of the opposed clamping plates 14. In one embodiment of the invention, the side plates 18 have a constant thickness throughout. As a result, the package 10 is rectangularly shaped.

The opposed clamping plates 14 are secured to the side plates 18 by a plurality of equally spaced threaded fasteners 20 (e.g. screws) that penetrate through pre-drilled openings in the opposed clamping plates 14 (not shown in the drawings) and through the side plates 18. The fasteners 20 cause the opposed clamping plates 14 to abut the side plates 18 and thereby cause the conductive plates 12 and semiconductor components 16 to compress and the side plates 18 to expand so that the combined height of the conductive plates 12 and semiconductor components 16 is equal to the height of the side plates 18. This results in a predetermined amount of pressure between the conductive plates 12 and semiconductor components 16.

A coolant inlet cap 22 and a coolant exit cap 24 are disposed at opposite ends of the package 10 and are secured to the opposed clamping plates 14 by electrically insulated threaded fasteners 21. The coolant inlet cap 22 has an opening 26 for the introduction of electrically insulating cooling fluid, normally a liquid such as oil, and has passages 28 at least equal in number to the number of conductive plates 12 and opposed clamping plates 14 for fluid to flow into the package 10. The fluid flows into the package 10 (to the left in FIG. 2) and through the passages 30 which are not restricted to being round and are extending throughout the conductive plates 12 as well as the opposed end plates 14 (FIG. 1) and effectively cools the system. Preferably, each plate 12 or 14 has a plurality of the passages 30 in parallel, side by side relation and each extending to one of the passages 28. The coolant exit cap 24 has a similar number of passages 32 to receive the fluid from the package 10 and an opening 34 to permit the fluid to exit the package 10. Seal plates 35 of electrically insulating material are disposed between the caps 22 and 24 and associated ends of the plates 12 and 14 to prevent leakage at the interfaces while maintaining electrical isolation of the plates, one to the other.

As mentioned earlier, the package 10 can be utilized with a plurality of circuitry arrangements as the clamping and cooling processes are independent of internal assemblage of the electrical components. The drawings illustrate only one type of circuitry arrangement which includes three stacks of semiconductor components 16 (e.q. transistors or diodes), each semiconductor component 16 being clamped between conductive plates 12 or a plate 12 and a plate 14.

Figure 3:
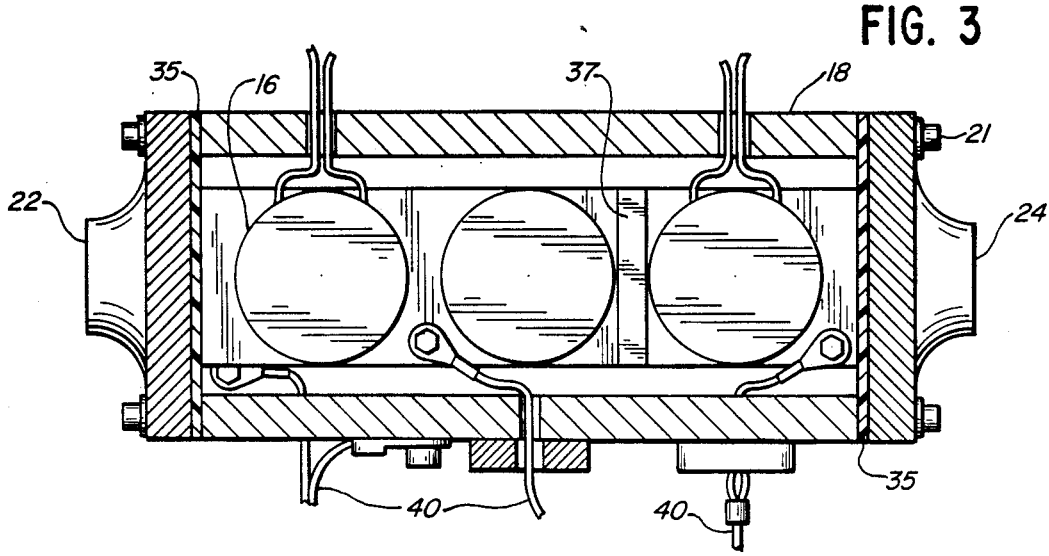
FIG. 3 is a horizontal sectional view of the semiconductor package taken approximately along the line 3—3 of FIG. 2, depicting the coolant inlet and outlet caps, three stacks of electrically conductive plates and semiconductor components and two side plates flanking the stacks.

In practicing the invention, the plates 12 and 14 are utilized as buses in the electrical circuit defined by the package 10. To this end, the plates 12 are usually substantially narrower than the plates 14 so that their sides are spaced from the plates 18 as seen in FIGS. 1 and 3. This spacing provides for electrical isolation of the plates 12 from the side plates 18.

Initially, however, and as seen in FIG. 1, one or more of the plates 12 may extend fully between the side plates 18. If electrical isolation is required in this instance, insulating plates 36 may be disposed between the sides of the plate 12 and the plates 18 as shown in FIG. 1.

Figure 2:
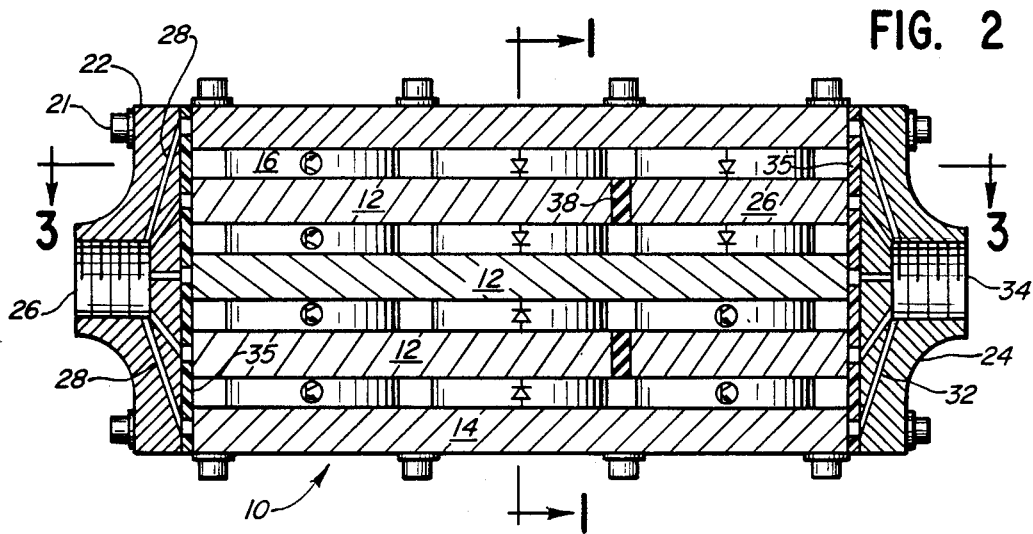
FIG. 2 is a vertical sectional view of the semiconductor package taken approximately along the line 2—2 of FIG. 1, illustrating three stacks of electrical components, the coolant inlet cap and the coolant exit cap.

In other instances, such as where there is a plurality of semiconductors 16 as illustrated in FIGS. 2 and 3, between each set of the plates 12, circuit considerations may require that one or more of the plates 12 are to be broken into two sections 12a and 12b and separated by a block of insulation 37 to similarly achieve electrical isolation.

Voids 38 separate the semiconductor components 16 for electrical isolation. Various leads 40, such as collector, base, output and emitter leads, are connected to the conductive plates 12. This internal array of components will allow a complete electrical assembly unit to be controlled by the various leads 40 attached to them.

As noted earlier, in one embodiment of the invention, the height of the side plates 18 is a predetermined amount less than the combined height of the conductive plates 12 and interposed semiconductor components 16. This height difference is chosen in connection with the characteristics of the materials of which the opposed end plates 14 and side plates 18 are formed such that when the former are firmly clamped to the latter by the threaded fasteners 20, the opposed end plates will be stressed sufficiently to place the desired compressing pressure on the interposed stack of conductive plates 12 and semiconductors 16.

In the illustrated embodiment of the invention, the actual pressure applied is then a function of the physical characteristics of the materials used, the height difference and the cross-section of at least the side plates 18 which will be placed in tension as a result of the clamping operation. The invention contemplates that this cross-section may be varied from the uniform cross-section in the illustrated embodiment if desired. For example, by tapering the side plates 18 on one or both sides of each side plate 18, the clamping force will be reduced over that provided by otherwise identical non-tapered side plates.

The ability of the invention to control clamping pressure by the selection of materials and/or geometry of the clamping elements provides a large degree of flexibility and allows the invention to be utilized with precise clamping pressure in many different environments.

It should also be noted that heat generated within the package 10 during the operation thereof which is not rejected via coolant flowing through the passages 28, 30, and thus raises the temperature of the internal components, is conducted or radiated to the side plates 18. As a consequence, their temperature will tend to closely parallel that of the components being compressed within the stack. This results in a relatively constant pressure being applied to the stack over the temperature range of operation of the package 10.

From the foregoing, it will be appreciated that the clamping and cooling processes are both effective and inexpensive. Due to the inherent simplicity of the package 10, an unskilled operator can merely stack the electrical components upon each other and tighten the fasteners 20 until the end plates 14 abut the side plates 18, resulting in a relatively maintenance-free, easy to handle package 10 with an efficient cooling system.

We claim:

1. A multiple phase electronic semiconductor package comprising;
    a stack of electrically conductive plates, including two opposite end plates, at least one interposed semiconductor component and two side plates flanking said stack;
    the height of said side plates being less than the height of said conductive plates and semiconductor components; and
    a means to secure said opposite end plates to said side plates causing a pre-determined amount of pressure between said conductive plates and semiconductor components.

2. A multiple phase electronic semiconductor package of claim 1 where said means securing said end plates to said side plates causes said conductive plates and semiconductor components to compress to a height substantially equal to the height of said side plates.

3. A multiple phase electronic semiconductor package of claim 1 where said package includes coolant inlet and exit caps at opposite ends of said package.

4. A multiple phase electronic semiconductor package of claim 3 where said conductive plates include passages extending therethrough.

5. A multiple phase electronic semiconductor package of claim 4 where fluid flow into said coolant inlet cap, through said passages in said conductive plates and out the coolant exit cap.

6. A multiple phase electronic semiconductor package comprising;
- a stack of electrically conductive plates, including two opposed clamping plates, at least one interposed semiconductor component and two side plates flanking said stack;
- the height of said side plates being a predetermined amount less than the combined height of said stack of the electrically conductive plates and semiconductor components when unstressed;
- a means to secure said opposed clamping plates to said side plates;
- said means causing said opposed clamping plates to abut said side plates and causing a predetermined amount of pressure between said conductive plates and semiconductor components; and
- said side plates thermally expanding with said conductive and semiconductor plates during use.

7. The multiple phase electronic semiconductor package of claim 6 where said means securing said opposite end plates to said side plates causes tension in said side plates.

8. The multiple phase electronic semiconductor package of claim 6 where said conductive plates include passages extending therethrough.

9. The multiple phase electronic semiconductor package of claim 8 where coolant inlet and exit caps are disposed at opposite ends of said package, said caps including passages extending from the caps into said package.

10. The multiple phase electronic semiconductor package of claim 9 where fluid is introduced in said package at said coolant inlet cap and passes through said passages in said conductive plates and exits said package at said exit cap, and thereby uniformly cools the package.

11. A multiple phase electronic semiconductor package comprising;
- a stack of electrically conductive plates, said plates including a plurality of passages extending therethrough, said stack including two opposed clamping plates, at least one interposed semiconductor component and two side plates flanking said stack;
- the height of said side plates being a predetermined amount less than the combined height of said stack of said electrically conductive plates and semiconductor components when unstressed, the length of said side plates equal to the length of said end plates, the side plates being a constant thickness throughout;
- a plurality of equally spaced threaded fasteners extending through said opposed clamping plates and into said side plates;
- said fasteners causing said opposed clamping plates to abut said side plates, and thereby causing a predetermined amount of pressure between said conductive plates and semiconductor components;
- said side plates thermally expanding with said conductive plates and semiconductor components during use, said pressure between said conductive plates and semiconductor is maintained relatively constant throughout;
- a coolant inlet cap and exit cap disposed at opposite ends of said package, both caps including at least one passage(s) for fluid to pass through; and
- means within said package interconnecting the passages of said caps and defining a coolant flow path thru said package in heat transfer relative to said semiconductor.

* * * * *